United States Patent
Honda

(10) Patent No.: US 6,876,580 B2
(45) Date of Patent: Apr. 5, 2005

(54) SEMICONDUCTOR MEMORY DEVICE HAVING A BURST CONTINUOUS READ FUNCTION

(75) Inventor: Yasuhiko Honda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/692,329

(22) Filed: Oct. 22, 2003

(65) Prior Publication Data

US 2005/0024942 A1 Feb. 3, 2005

(30) Foreign Application Priority Data

Aug. 1, 2003 (JP) .................................. 2003-205379

(51) Int. Cl.⁷ .............................................. G11C 16/06
(52) U.S. Cl. .................... 365/185.21; 365/200; 365/194
(58) Field of Search .......................... 365/185.21, 200, 365/194, 233, 185.11, 185.2

(56) References Cited

U.S. PATENT DOCUMENTS 5,319,759 A    6/1994  Chan
5,892,713 A *  4/1999  Jyouno et al. ......... 365/185.11

FOREIGN PATENT DOCUMENTS

JP    2001-167593    6/2001

* cited by examiner

*Primary Examiner*—David Lam
(74) *Attorney, Agent, or Firm*—Hogan & Hartson, LLP

(57) ABSTRACT

Several sense amplifiers detect data read from a memory cell of a bank in accordance with read address. Several first holding circuits individually hold data output from the sense amplifiers. Several second holding circuits hold data output from the corresponding first holding circuit after being delayed by time that the read address gains with respect to the burst address. Decoders individually supply data held in several second holding circuits to the corresponding line of a bus line.

20 Claims, 12 Drawing Sheets

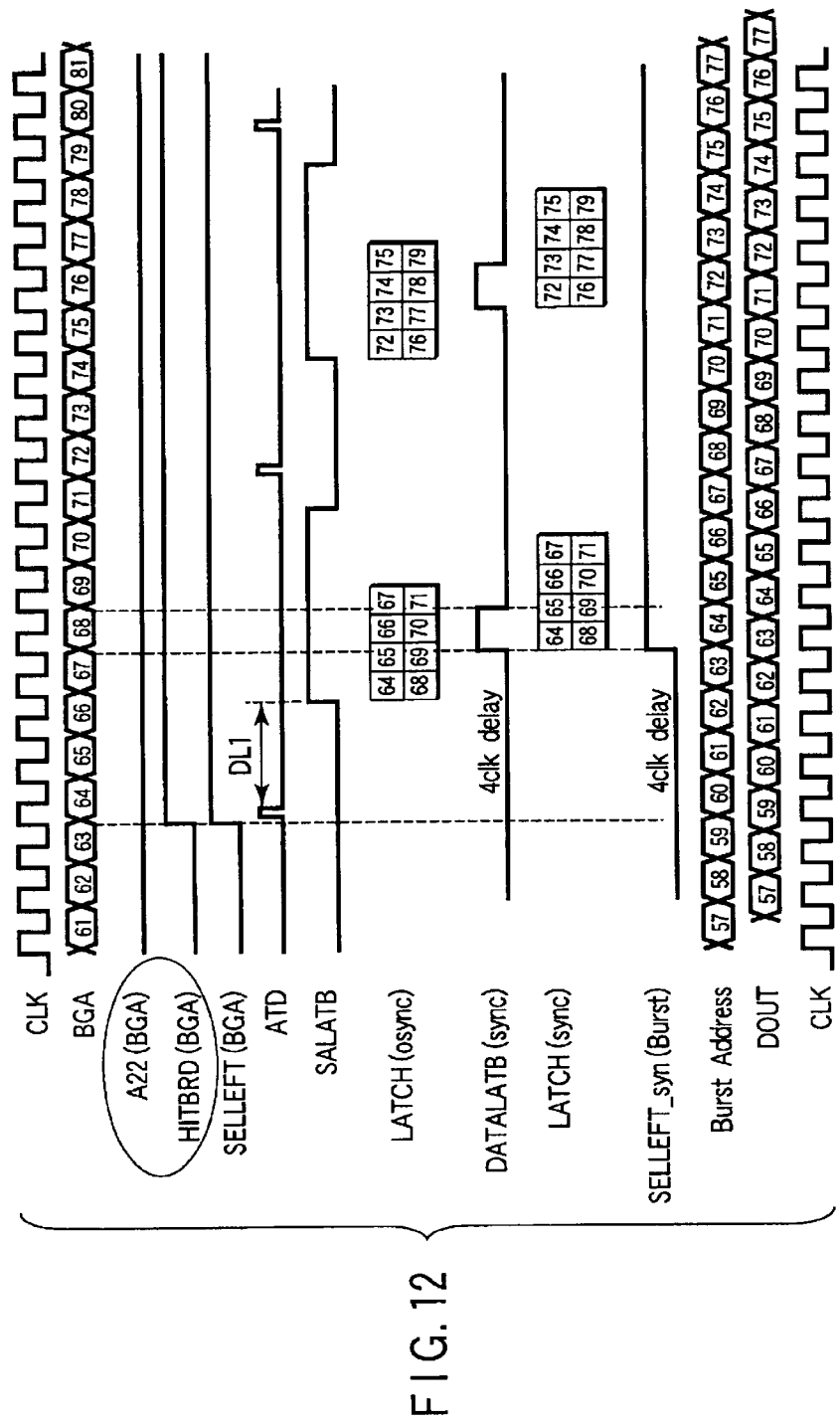
F I G. 12

SEMICONDUCTOR MEMORY DEVICE HAVING A BURST CONTINUOUS READ FUNCTION

CROSS-REFERENCE TO RELATED APPLICATIONS

This application is based upon and claims the benefit of priority from the prior Japanese Patent Application No. 2003-205379, filed Aug. 1, 2003, the entire contents of which are incorporated herein by reference.

BACKGROUND OF THE INVENTION

1. Field of the Invention

The present invention relates to a semiconductor memory device having a burst continuous read function, such as a non-volatile semiconductor memory device.

2. Description of the Related Art

Recently, non-volatile semiconductor memory devices such as flash memories and dynamic RAMs have been improved to have a large capacity. In order to read data from such large-capacity semiconductor memory devices at high speed, the memory cell array is divided into several banks. Each bank is provided with a plurality of sense amplifiers so that the capacity of data lines can be reduced. In addition, burst read architecture using internal addresses different from external addresses is applied.

FIG. 26 shows one configuration of a conventional semiconductor memory device. The same number of bus lines 103 as the burst length is arranged common to banks 101 and 102. One end of the bus lines 103 is connected with a plurality of sense amplifiers included in bank output circuits 104 and 105, and the other end thereof is connected with an output switch circuit 106. The output switch circuit 106 has the same number of synchronous latch circuits 106a and switch circuits 106b as the bus lines 103. The synchronous latch circuits 106a individually latch data transmitted to each bus line 103. The data latched by the synchronous latch circuits 106a are successively output from the switch circuit 106b, which operates in accordance with a clock signal.

In the conventional semiconductor memory device, burst continuous read continuously reading data stored in the several banks is carried out. In this case, the synchronous latch circuit 106a is provided in the output switch circuit 106 so that the data of both banks 101 ad 102 can be held. Thus, it is possible to continuously output data situated on the boundary between the banks 101 and 102.

However, the conventional semiconductor memory device requires as many lines as the bus lines 103 for connecting sense amplifiers 104 and 105 with the synchronous latch circuit 106a of the output switch circuit 106. For example, if the burst length is 8 words (one word: 16 bits), that is, 128 bits, 128 lines are required. In addition, there is a tendency for the burst length to become longer in the future; for this reason, the bus line 103 has large area penalty. Therefore, even if the burst length becomes longer, it is desired to provide a semiconductor memory device which can prevent the bus line area from increasing, and can surely make a read operation.

Incidentally, JPN. PAT. APPLN. KOKAI Publication No. 2001-167593 discloses a technique capable of performing continuous read operation (gapless burst read) in a burst read type synchronous mask ROM.

BRIEF SUMMARY OF THE INVENTION

According to a first aspect of the invention, there is provided a semiconductor memory device comprising: a bank having a plurality of arrayed memory cells: a bus line transmitting data read from the bank, and having a line equivalent to one word; a plurality of sense amplifiers detecting data read from a memory cell of the bank in accordance with a read address; a plurality of first holding circuits individually holding data output from each of the sense amplifiers; a plurality of second holding circuits individually holding data output from each of the first holding circuits, and holding data output from the corresponding first holding circuit after being delayed by time when the read address gains with respect to burst address; and a decoder supplying data held in the plurality of second holding circuits to the corresponding line of the bus line.

According to a second aspect of the invention, there is provided a semiconductor memory device comprising: a first bank having a plurality of arrayed memory cells; a second bank having a plurality of arrayed memory cells: first and second output circuits provided correspondingly to the first and second banks, the first and second output circuits outputting data read from the corresponding the plurality of memory cells in accordance with read address, and being activated after being delayed by time that the read address gains with respect to the burst address when select is changed from one of the first and second banks to the other thereof; and a select circuit selecting the first and second output circuits, the select circuits selecting one of the first and second banks after being delayed by time that the read address gains with respect to the burst address when select is changed from one of the first and second banks to the other thereof.

According to a third aspect of the invention, there is provided a semiconductor memory device comprising: a first bank having a plurality of arrayed memory cells; a second bank having a plurality of arrayed memory cells: a redundancy memory having a plurality of memory cells storing data of defective block of the first and second banks; an address memory storing an address of the defective block; a comparator comparing an address for reading one data of the first and second banks with the address of the defective block stored in the address memory section, and outputting a coincidence signal if the former address and the later address coincide with each other; and a selector circuit selecting the redundancy memory after being delayed by time that the read address gains with respect to the burst address when the comparator outputs the coincidence signal.

According to a fourth aspect of the invention, there is provided a semiconductor memory device comprising: a bank having a plurality of arrayed memory cells; a first bus line transmitting even data read from the bank, and having a bit width equivalent to one word; a second bus line transmitting odd data read from the bank and the redundancy memory, and having a bit width equivalent to one word; a plurality of first sense amplifiers detecting even data read from a memory cell of the bank in accordance with read address; a plurality of second sense amplifiers detecting odd data read from the memory cell of the bank in accordance with read address; a plurality of first holding circuits individually holding data output from each of the first sense amplifiers; a plurality of second holding circuits individually holding data output from each of the second sense amplifiers; a plurality of third holding circuits individually holding data output from the first holding circuits after being delayed by time that the read address gains with respect to the burst address; a plurality of fourth holding circuits individually holding data output from the second holding circuits after one clock later than the third holding circuit; a first decoder supplying data held in the third holding circuits to the first bus line; a second decoder supplying data held in the fourth holding circuits to the second bus line; and an output circuit connected to the first and second bus lines, and alternately outputting data transmitted from the first and second bus lines.

BRIEF DESCRIPTION OF THE SEVERAL VIEWS OF THE DRAWING

FIG. 12 is a timing chart to explain the operation of FIG. 10 and FIG. 11;

DETAILED DESCRIPTION OF THE INVENTION

Figure 1:
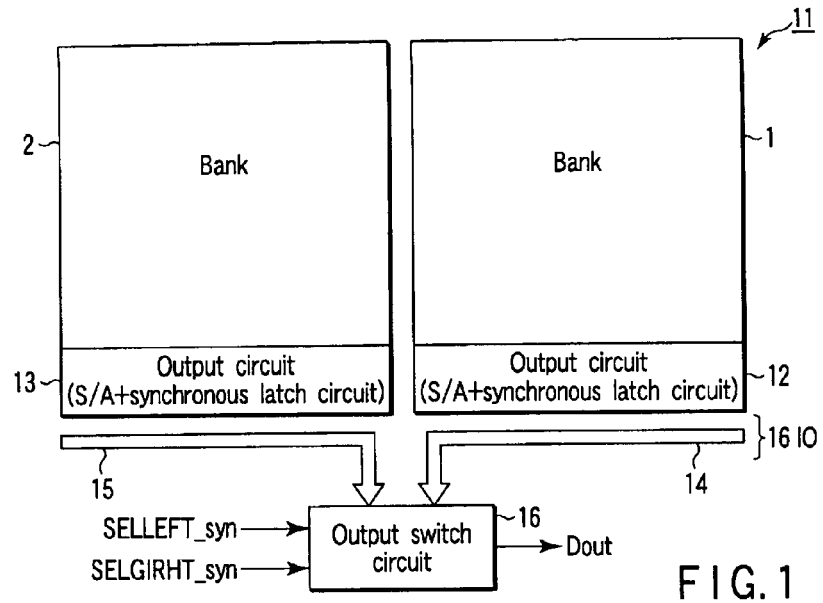
FIG. 1 is a view showing the configuration of a semiconductor memory device according to a first embodiment of the present invention.

Embodiment of the present invention will be described below with reference to the accompanying drawings. In the drawings, the same reference numerals are used to designate the identical portions.

(First Embodiment)

FIG. 1 schematically shows the first embodiment. A semiconductor memory device 11 has two banks 1 and 2. Output circuits 12 and 13 are arranged correspondingly to the banks 1 and 2. The output circuits 12 and 13 individually have a sense amplifier, first and second latch circuits and a page decoder, as described later. Bus lines 14 and 15 are arranged correspondingly to the banks 1 and 2. Each of the bus lines 14 and 15 is composed of 16 lines. One end of the bus line 14 is connected to a page decoder of the output circuit 12: on the other hand, one end of the bus line 15 is connected to a page decoder of the output circuit 13. The other ends of the bus lines 14 and 15 are connected to an output switch circuit 16. The output switch circuit 16 selects one of the bus lines 14 and 15 in accordance with bank select signals SELLEFT_syn and SELRIGHT_syn, and outputs data of the selected bus line in synchronous with a clock signal.

Figure 2:
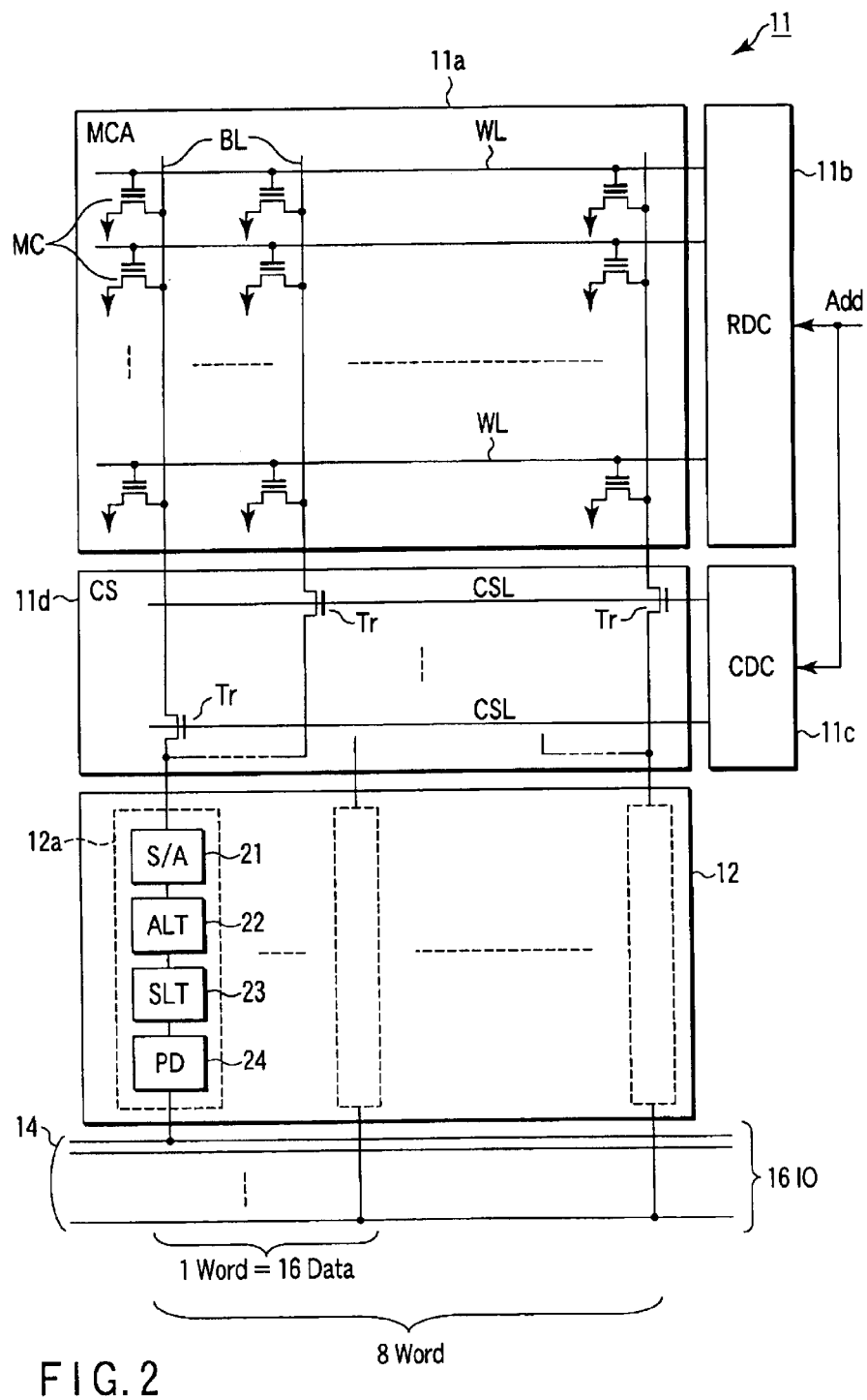
FIG. 2 is a view showing the configuration of one bank of FIG. 1.

FIG. 2 shows the configuration of the bank 1 shown in FIG. 1. In the bank 1, a memory cell array (MCA) 11a comprises a NOR flash EEPROM, for example. Many memory cells MC arranged like matrix are connected to a word line WL and a bit line BL. A row decoder (RDC) 11b selects the corresponding word line WL in accordance with part of an address signal Add. A column decoder (CDC) selects a column select line CSL constituting a column select circuit (CS) 11d in accordance with part of the address signal Add. The column select circuit 11d has a plurality of transistors Tr connected to each bit line. The transistors Tr select the bit line BL when the column select line CSL is activated.

The output circuit 13 includes sense amplifier units 12a equivalent to 128 bits=16 bits (one word)×8 words. One end of each sense amplifier unit 12a is connected to the column select circuit 11d, and the other end thereof is connected to each line of the bus line 14.

Figure 3:
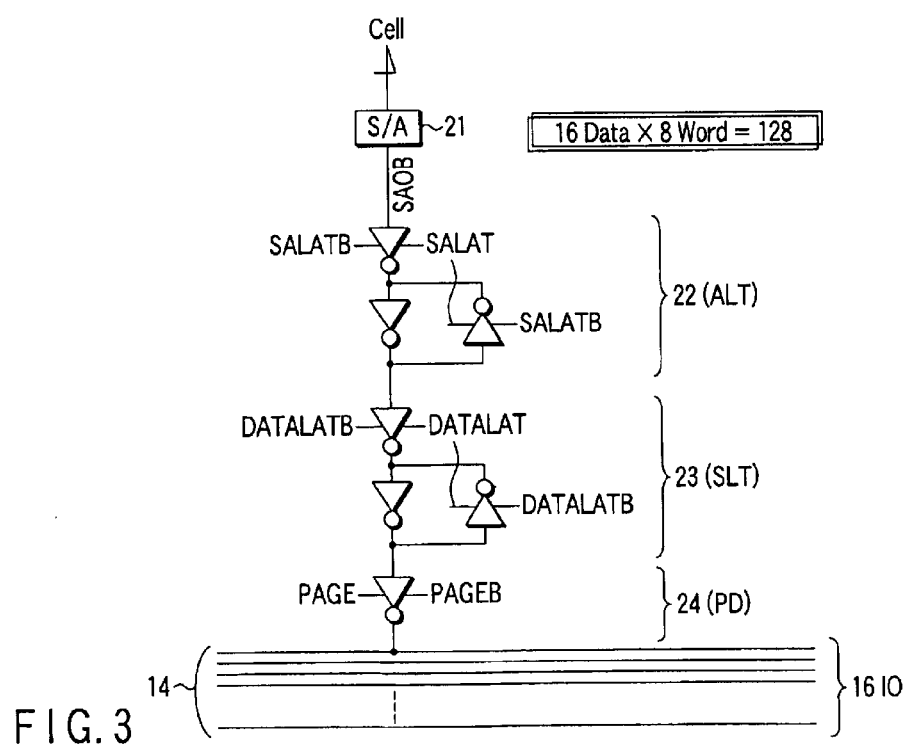
FIG. 3 is a circuit diagram showing the configuration of part of FIG. 2.

FIG. 3 shows the configuration of each sense amplifier unit 12a. The sense amplifier unit 12a comprises a serial-connected sense amplifier 21, a first latch circuit 22, a second latch circuit 23, and a page decoder (PD) 24. The first and second latch circuit 22 comprises an asynchronous latch circuit (ALT) and a synchronous latch circuit (STL), respectively. The first latch circuit 22 is controlled according to a control signal SALAT and its inverted signal SALATB, which dos not depend on a clock signal. The page decoder 24 is controlled according to a control signal PAGE generated in accordance with page address, and its inverted signal PAGEB. The page decoder 24 decodes 128-bit data read from the memory cell array 11a to 16-bit data per word corresponding to one page.

Figure 4:
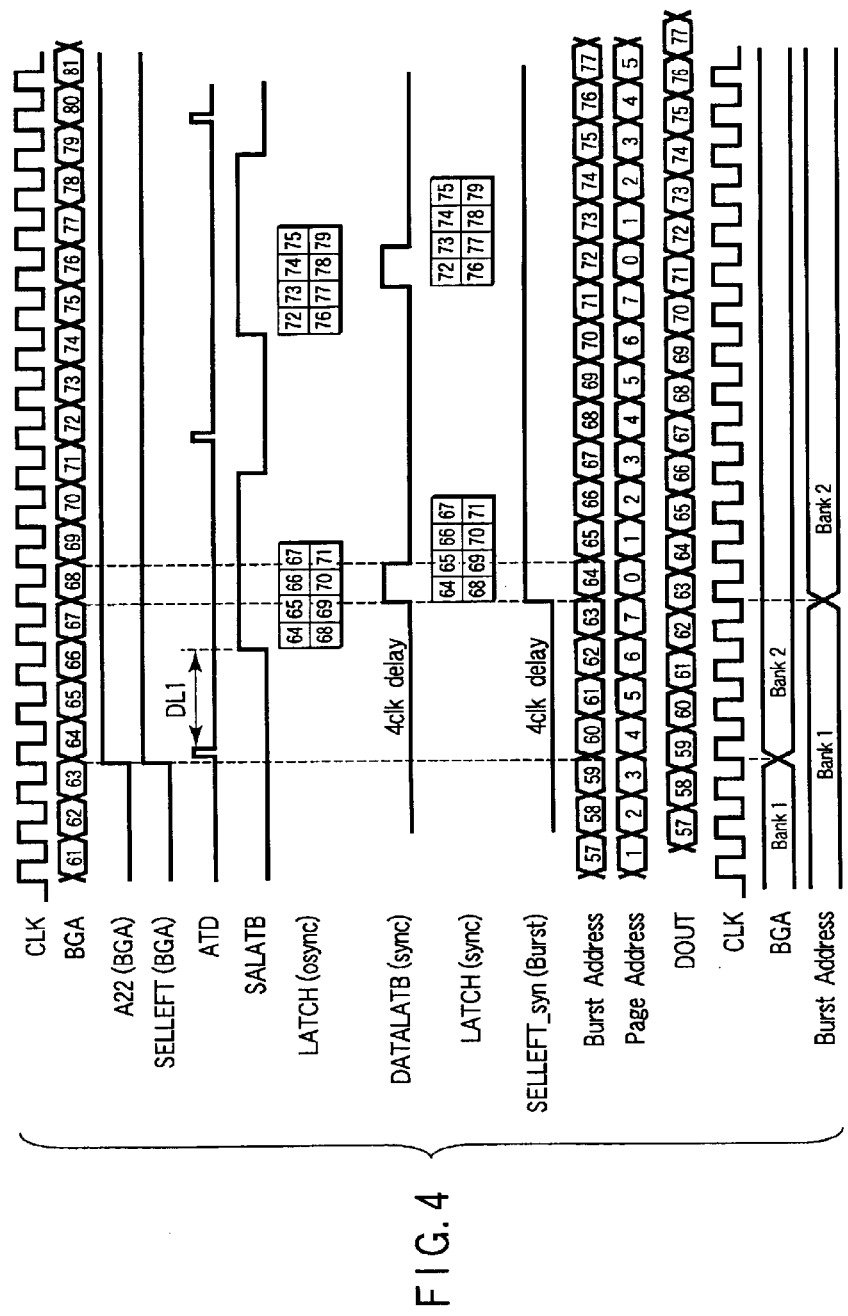
FIG. 4 is a timing chart to explain the operation of FIG. 1 to FIG. 3.

A burst continuous read operation based on the foregoing configuration will be described with reference to FIG. 4. FIG. 4 shows the operation when reading data positioned on the boundary between banks 1 and 2. As shown in FIG. 4, according to the burst continuous read, a background address (BGA) for reading the memory cell array data gains four clocks as compared with burst address. For example, if the burst address is "57", the BGA is "61". Namely, data equivalent to four clocks is read prior to the burst address. In addition, when reading data from the memory cell array 11a, data equivalent to 8 words are collectively read by one-time access. The data equivalent to 8 words are decoded every one word by the page decoder 24 controlled in accordance with page address, and thereafter, transferred successively to the bus line 15. The data transmitted to the output switch circuit 16 via the bus line 15 are successively output in accordance with burst address.

As seen from FIG. 4, when the data read of the bank 1 gains and the BGA most significant bit A22 becomes high level, the bank select signal SELLEFT (BGA) is activated, so that the changeover from bank 1 to bank 2 can be made. The sense amplifier 21 of each sense amplifier unit 12a detects data read from the bank 2. In addition, when the bit A3 of bits A0 to A3 constituting the page address becomes high level, an address transition detection signal (ATD) is output. After delay time DL1 arbitrarily set by the ATD elapses, the control signal SALATB is activated. In accordance with the control signal SALATB, the first latch circuit 22 is activated, so that the data detected by the sense amplifier 21 can be held in the first latch circuit 22.

As described above, when the bank 2 is selected, the burst address is delayed for four words. For this reason, if the select of the second latch circuit 23 is changed simultaneously with the changeover from bank 1 to bank 2, the next bank data is output without outputting all of the read data in the bank 1.

In order to solve the foregoing problem, according to the first embodiment, the consistency of burst address and BGA in the bank changeover is synchronously secured. Namely, the BGA gains prior to the burst address after the bank is changed; therefore, the second latch circuit 23 is activated for the delay of the time describe above, that is, four clocks in the embodiment. In other words, the bank select signal SELLEFT (BGA) is activated, and thereafter, the control signal DATALATB is activated after four clocks elapse, as seen from FIG. 4. In addition, the control signal SELLEFT_syn (Burst) is activated after the elapse of four clocks after the bank select signal SELLEFT (BGA) is activated. The second latch circuit 23 and the output switch circuit 16 are controlled in the manner described above. By ding so, the read data can be securely output in the changeover of the bank.

Figure 5:
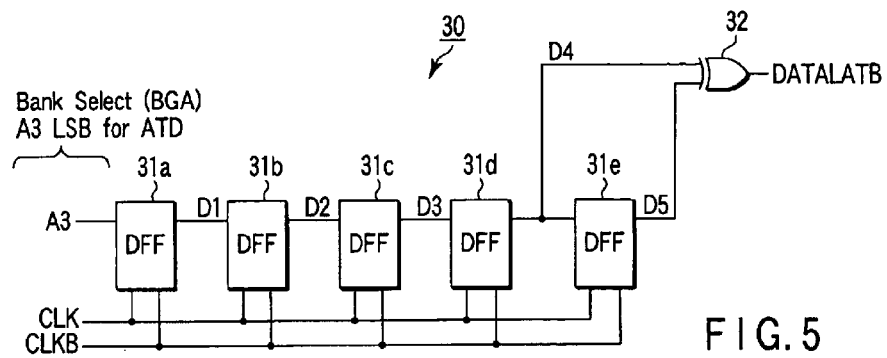
FIG. 5 is a circuit diagram showing the configuration of a generator circuit for control signal DATALATB shown in FIG. 3 and FIG. 4.

FIG. 5 shows the configuration of a generator circuit 30 for generating the control signal DATALATB. The generator circuit 30 is composed of five series-connected D-type flip-flop circuits (DFF) 31a to 31e, and an EX-OR circuit 32 having input terminals connected to output terminals of the DFFs 31d and 31e. The most significant bit A3 signal of the page address is supplied to an input terminal of the DFF 31a. Clock signals CLK and CLKB are supplied to each of the DFFs 31a to 31e.

Figure 6:
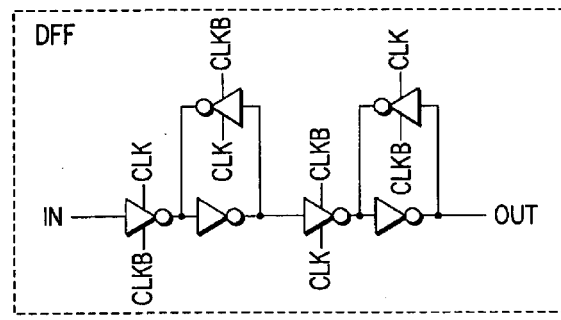
FIG. 6 is a circuit diagram showing the configuration of DFF shown in FIG. 5.

FIG. 6 shows the configuration of the DFF. The DFF comprises a two-stage latch circuit, which is controlled according to clock signals CLK and CLKB.

Figure 7:
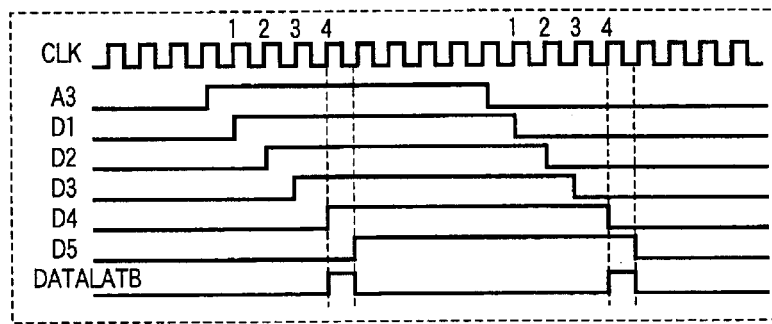
FIG. 7 is a timing chart showing the operation of FIG. 5.

FIG. 7 shows the operation of the generator circuit 30 shown in FIG. 5. As shown in FIG. 7, the most significant bit A3 signal of the page address is successively transferred to DFFs 31a to 31e in accordance with clock signals CLK and CLKB. The control signal DATALATB output from the EX-OR circuit 32 becomes high level at the fourth clock. The control signal DATALATB is output for the delay of four clocks every when the most significant bit A3 signal of the page address is changed. The control signal DATALATB thus generated is supplied to the second latch circuit 23. Therefore, the second latch circuit 23 is activated for the delay of four clocks from ATD every when the ATD is output as seen from FIG. 4, and holds 8-word data.

Figure 8:
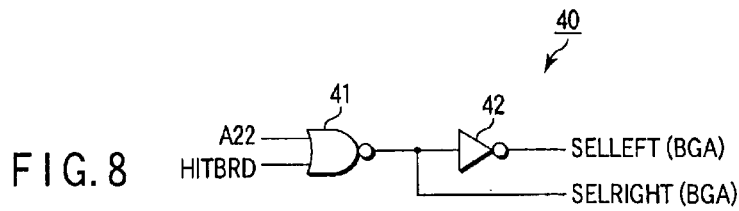
FIG. 8 is a circuit diagram showing the configuration of a bank select circuit.

FIG. 8 shows the configuration of a bank select circuit 40. The most significant bit A22 signal of the BGA is supplied to a NOR circuit 41 together with a coincidence signal (HITBRD) indicative of detecting defective address described later. A bank select signal SELRIGHT (BGA) for selecting the bank 1 is output from the output terminal of the NOR circuit 41. In addition, a bank select signal SELLEFT (BGA) for selecting the bank 2 is output via an inverter circuit 42 connected to the output terminal of the NOR circuit 41. Bank 1 or 2 is selected in accordance with these bank select signals SELRIGHT (BGA) and SELLEFT (BGA).

Figure 9:
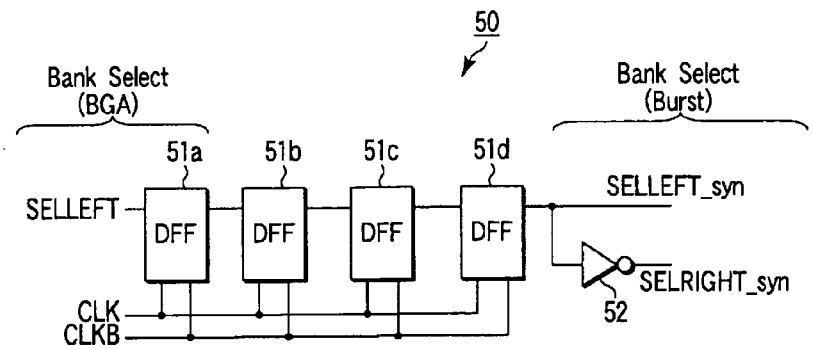
FIG. 9 is a circuit diagram showing the configuration of an output select circuit.

FIG. 9 shows the configuration of an output select circuit 50. The output select circuit 50 is composed of series-connected four DFFs 51a to 51d, and an inverter circuit 52 having an input terminal connected to the output terminal of the DFF 51d. For example, the bank select signal SELLEFT (BGA) is supplied to the input terminal of DFF 51a. DFFs 51a to 51d are supplied with clock signals CLK and CLKB. The bank select signal SELLEFT (BGA) is successively transferred to DFFs 51a to 51d in accordance with clock signals CLK and CLKB. The output signal SELLEFT_syn of the DFF 51d becomes high level at the fourth clock. Simultaneously, a signal SELRIGHT_syn output from the inverter circuit 52 becomes low level. Control signals SELLEFT_syn and SELRIGHT_syn thus generated are supplied to the output switch circuit 16. The output switch circuit 16 selects one of bus lines 14 and 15 in accordance with control signals SELLEFT_syn and SELRIGHT_syn.

According to the first embodiment, each of banks 1 and 2 is provided with several second latch circuits 23 synchronizing with clock signal. Output data of these second latch circuits 23 are decoded by the page decoder 24, and thereby, connected to bus lines 14 and 15. Thus, the number of bus lines 14 and 15 is reduced as compared with the bus lines corresponding to the burst length. As a result, the space for arranging bus lines can be reduced even if the burst length becomes longer.

The second latch circuits 23 synchronizing with clock signal is provided in each of banks 1 and 2, and the second latch circuits 23 is operated after being delayed by time when background read address (BGA) gains prior to burst address. The output switch circuit 16 outputs control signals SELLEFT_syn and SELRIGHT_syn, which are delayed by time when background read address (BGA) gains prior to burst address. The output switch circuit 16 selects one of bus lines 14 and 15 in accordance with these control signals SELLEFT_syn and SELRIGHT_syn. More specifically, the sense amplifier 21 and the first latch circuit 22 are selected according to BGA. On the other hand, the second latch circuit 23 is activated after four clocks elapse after the bank is changed according to BGA, and holds the output data of the first latch circuit 22. Control signals SELLEFT_syn and SELRIGHT_syn are output for the delay of four clocks with respect to BGA. By doing so, BGA gains by four clocks; however, burst address has no influence. Therefore, the data of the bank previously selected is output to the last, and thereafter, the change to data output processing for the next bank is made. As described above, the second latch circuits 23 synchronizing with clock signal is provided correspondingly to each bank. According to the configuration, it is possible to securely read data positioned on the boundary between banks 1 and 2, and to output it.

(Second Embodiment)

Figure 10:
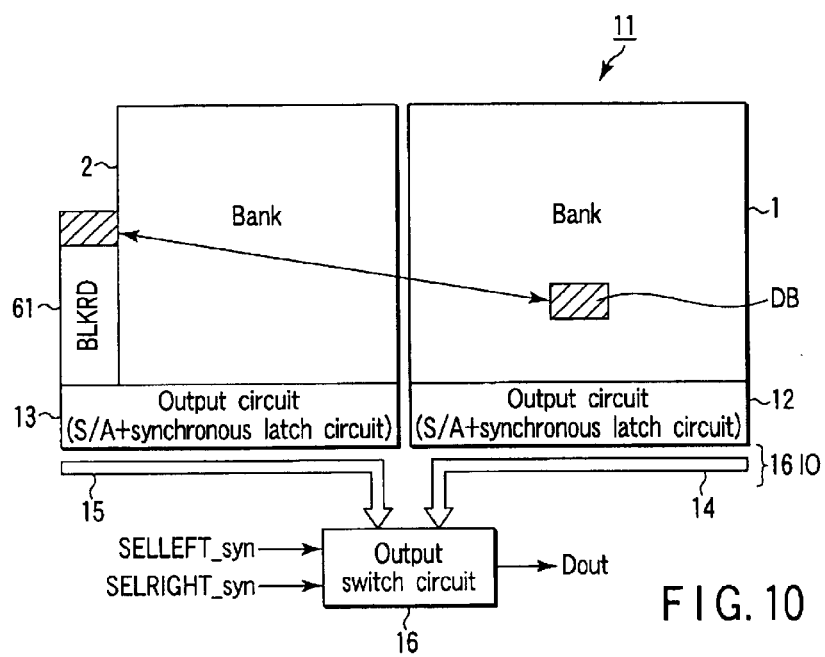
FIG. 10 is a view showing the configuration of a semiconductor memory device according to a second embodiment of the present invention.

FIG. 10 shows the configuration of a semiconductor memory device according to the second embodiment. The second embodiment relates to the case where the present invention is applied to block redundancy. For example, block redundancy of replacing defective cell with redundancy cell at the unit of block is employed in a NOR flash EEPROM. According to the block redundancy, a redundancy block (BLKRD) 61 is provided independently from banks 1 and 2 in order to recover defective block generated in any of banks 1 and 2. According to the second embodiment shown in FIG. 10, the redundancy block 61 is arranged adjacent to the bank 2. However, this is merely one example, and the redundancy block 61 may be arranged adjacent to the bank 1. The redundancy block 61 has a capacity capable of recovering several defective blocks. The redundancy block 61 is connected to the same output circuit 13 as the bank 2. More specifically, redundancy column decoder and redundancy column select circuit (not shown) are provided independently from the column decoder and the column select circuit. The output circuit 13 is used common to the bank 2 and the redundancy block 61 using the foregoing redundancy column decoder and redundancy column select circuit. In the redundancy block 61, the selected memory cell array is connected to the sense amplifier unit 12a of the output circuit 13 via the redundancy column select circuit drive by the redundancy column decoder. Data read from the selected memory cell of the redundancy block 61 is supplied to the bus line 15 via the sense amplifier 12a.

Figure 11:
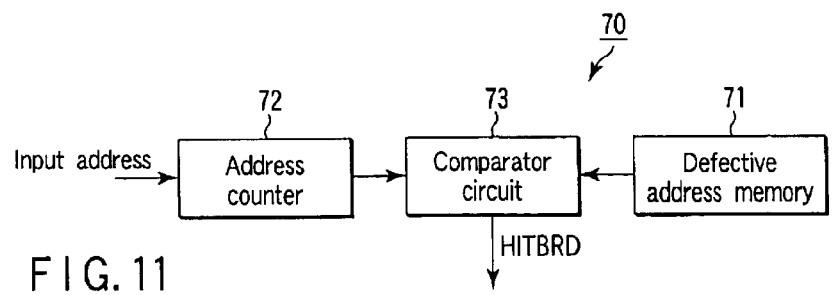
FIG. 11 is a view showing the configuration of an defective address detection circuit 70.

FIG. 11 shows the configuration of a defective address detection circuit 70. A defective address memory 71 stores the address of defective cell of each bank. An address counter 72 counts an input address to generate an internal address. A comparator circuit 73 compares the internal address supplied from the address counter 72 with the address of defective cell supplied from the defective address memory 71. As a result, if the former address and the later address coincides with each other the comparator circuit 73 the coincidence signal HITBRD described before. The coincidence signal HITBRD is supplied to the NOR circuit 41 of the bank select circuit 40 shown in FIG. 8. The bank select circuit 40 outputs the bank select signal SELLEFT (BGA) for selecting the bank 2 in accordance with the coincidence signal HITBRD.

FIG. 12 shows the operation when making defective block access in the burst continuous read based on the identical architecture to the first embodiment.

As shown in FIG. 10, a defective block DB exists in the bank 1. The operation of replacing the defective block DB with the corresponding block of the redundancy block 61 will be described with reference to FIG. 12. When the data of the bank 1 is read, the bit A22 for selecting the bank becomes low level. When the data read of the bank 1 gains and BGA coincides with the address "64" of the defective cell, the coincidence signal HITBRD output from the comparator circuit 73 becomes high level. With the operation, the bank select circuit 40 shown in FIG. 8 sets the signal SELLEFT (BGA) for selecting the bank 2 to high level. Thus, the memory cell corresponding to the address "64" of the redundancy block 61 is selected. In this case, the read of the banks 1 and 2 is inhibited in accordance with the coincidence signal HITBRD.

When the redundancy block 61 is selected, burst address is delayed for time equivalent to four words. For this reason, if the select of the second latch circuit 23 is changed simultaneously with the changeover from the bank 1 to the redundancy block 61, the following problem arises. Namely, in the bank 1, the data of the redundancy block 61 is output without outputting all of the read data.

In order to solve the problem, according to the second embodiment, the consistency of burst address and BGA in the bank changeover is synchronously secured in the changeover from the bank 1 to the redundancy block 61. More specifically, the second latch circuits 23 is activated for the delay of time when BGA gains prior to burst address after the changeover from the bank 1 to the redundancy block 1, that is, four clocks in the second embodiment. In other words, the bank select signal SELLEFT (BGA) is activated, and thereafter, the control signal DATAATB is activated after four clock elapse, as seen from FIG. 12. In addition, the bank select signal SELLEFT (BGA) is activated, and thereafter, the control signal SELLEFT_syn (Burst) controlling the output switch circuit 16 is activated after four clock elapse. The second latch circuit 23 and the output switch circuit 16 are controlled in the manner described above. By doing so, read data can be securely output in the changeover from the bank 1 to the redundancy block 61.

The second embodiment has explained about the case of replacing the defective block of the bank 1 with the redundancy block 61. The same operation as above is made in the case of replacing the defective block of the bank 1 with the redundancy block 61.

According to the second embodiment, the following operations are carried out when replacing the defective block of the bank 1 with the redundancy block 61. The redundancy block 61 is selected, and thereafter, the second latch circuit 23 is activated after being delayed by the delay of bank address with respect to BGA. The output switch circuit 16 is activated after being delayed by the delay of bank address with respect to BGA, and thereafter, the bus line 15 to which the redundancy block 61 is connected is selected. Therefore, previously read data can be securely output even if the defective block is replaced with the redundancy block.

The second output circuit is used common to the second bank 2 and the redundancy block 61. Therefore, the circuit configuration can be simplified, and also, the area can be reduced.

(Third Embodiment)

In the first and second embodiments, the burst read rate is determined by the delay time until data held by the synchronous latch circuit provided in each bank is decoded and output using the clock signal supplied from the outside as a trigger.

According to the third embodiment, higher speed burst read is achieved. The bus line from the synchronous latch circuit to the output switch circuit is doubled. By doing so, data output by the next clock signal is previously read in the output switch circuit. In this manner, a delay for decoding the output of the synchronous latch circuit is offset with respect to the next clock signal, and thereby, data can be output at high speed.

Figure 13:
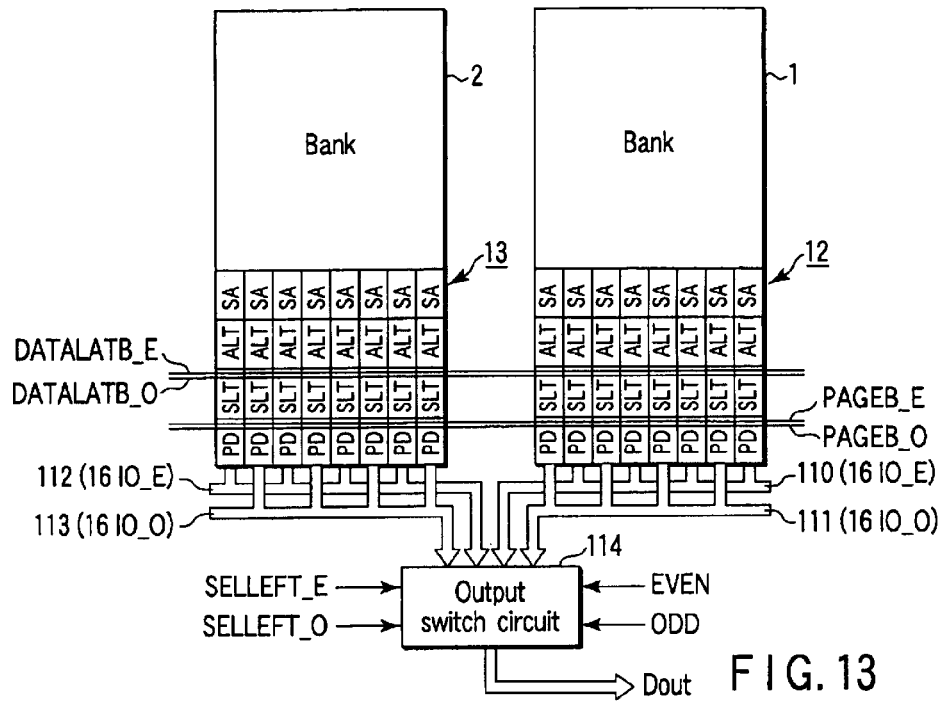
FIG. 13 is a view showing the configuration of a semiconductor memory device according to a third embodiment of the present invention.

FIG. 13 schematically shows the configuration of a semiconductor memory device according to the third embodiment. A semiconductor memory device 11 has two banks 1 and 2. Output circuits 12 and 13 are arranged correspondingly to these banks 1 and 2, respectively. The output circuits 12 and 13 have the same configuration as the first embodiment, and are provided with several sense amplifier units. The sense amplifier units are divided into odd page and even page. Each sense amplifier unit has a sense amplifier, first and second latch circuits, and a page decoder, as described later.

A bus line 110 for transmitting even page data and a bus line 111 for transmitting odd page data are arranged with respect to the bank 1. A bus line 112 for transmitting even page data and a bus line 113 for transmitting odd page data are arranged with respect to the bank 2. These bus lines 110 to 113 are individually composed of 16 lines per word. One end of the bus line 110 is connected to an even-page page decoder of the output circuit 12, and one end of the bus line 111 is connected to an odd-page page decoder thereof. One end of the bus line 112 is connected to an even-page page decoder of the output circuit 13, and one end of the bus line 113 is connected to an odd-page page decoder thereof. The other ends of these bus lines 110 to 113 are connected to an output switch circuit 114. The output switch circuit 114 selects one of bus lines 110, 111 or 112, 113 in accordance with control signals SELLEFT_E and SELRIGHT_O. Further, the output switch circuit 114 alternately outputs data of the selected pair of bus lines in synchronous with an even select signal EVEN and an odd select signal ODD.

Figure 14:
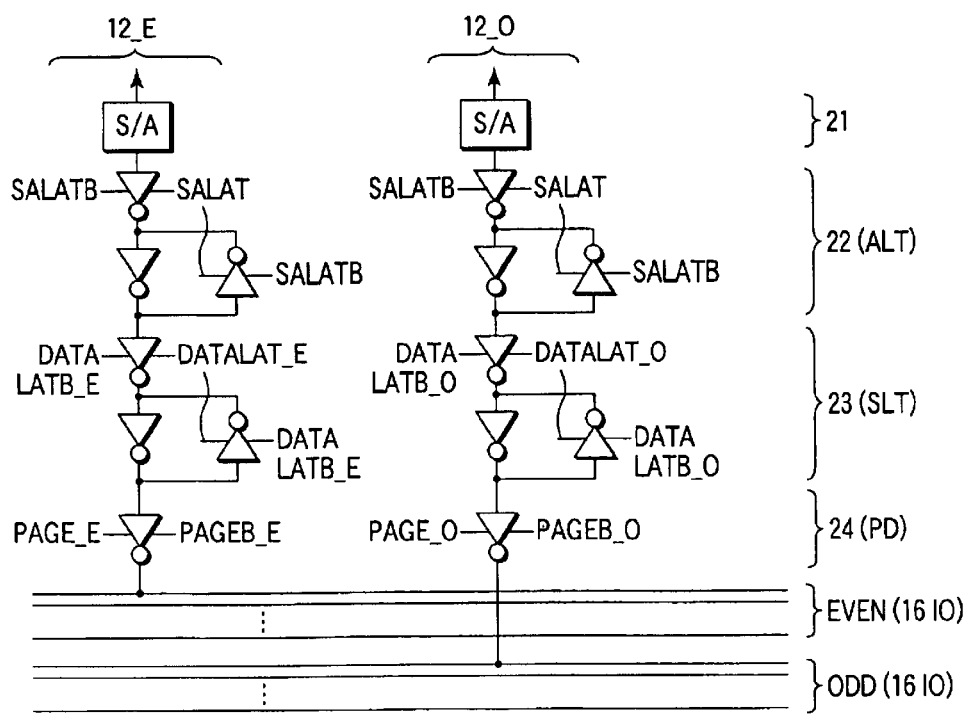
FIG. 14 is a circuit diagram showing the configuration of part of FIG. 13.

FIG. 14 shows each configuration of an even page sense amplifier unit 12_E and an odd page sense amplifier unit 12_O, which constitute the output circuit 12. Each page comprises 16 sense amplifier units. Each of sense amplifier units 12_E and 12_O is composed of a series-connected sense amplifier 21, first and second latch circuits 22 and 23, and a page decoder (PD) 24. The first and second latch circuits 22 and 23 comprise an asynchronous latch circuit (ALT) and a synchronous latch circuit (SLT), respectively.

The first latch circuit 22 is controlled according to a control signal SALAT and its inverted signal SALATB, which do not depend on a clock signal. The second latch circuit 23 is controlled according to a control signal depending on the clock signal and its inverted signal. More specifically, the even-page second latch circuit 23 is controlled according to signals DATALAT_E and DATALATB_E. On the other hand, the odd-page second latch circuit 23 is controlled according to signals DATALAT_O and DATALATB_O.

The page decoder 24 is controlled according to a control signal generated in accordance with page address and its inverted signal. More specifically, the even-page page decoder 24 is controlled according to signals PAGE_E and PAGEB_E. On the other hand, the odd-page page decoder 24 is controlled according to signals PAGE_O and PAGEB_O. The even-page page decoder 24 decodes 128-bit data read from the memory cell array 11a into 16-bit data per word corresponding to even pages. The odd-page page decoder 24 decodes 128-bit data read from the memory cell array 11a into 16-bit data per word corresponding to odd pages.

Figure 15:
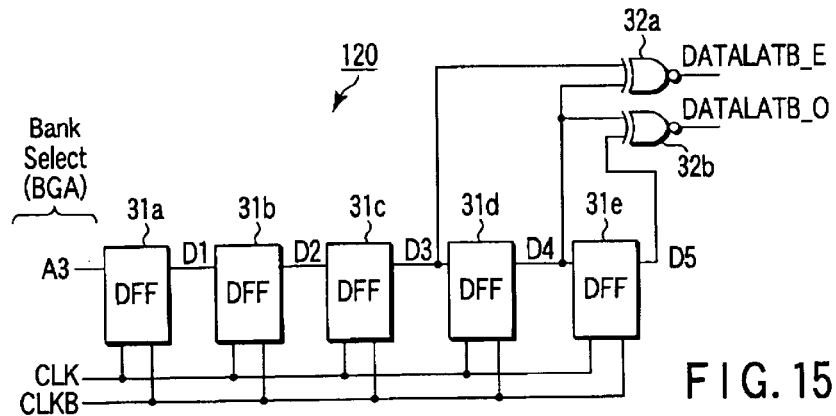
FIG. 15 is a circuit diagram showing the configuration of a generator circuit for control signals DATALATB_E and DATALATB_O shown in FIG. 13 and FIG. 14.

FIG. 15 shows the configuration of a generator circuit 120 for generating the control signals DATALATB_E and DATALATB_O. The generator circuit 120 has substantially the same configuration as the generator circuit shown in FIG. 5. Namely, the generator circuit 120 comprises five series-connected D-type flip-flop circuits (DFF) 31a to 31e, and EX-OR circuits 32a and 32b individually having input terminals connected to output terminals of the DFFs 31d and 31e. The most significant bit A3 signal of the page address is supplied to an input terminal of the DFF 31a. DFFs 31a to 31e are supplied with clock signals CLK and CLKB. The EX-OR circuit 32a outputs the control signal DATALATB_E in accordance with an output signal D3 of the DFF 31c and an output signal D4 of the DFF 31d. The EX-OR circuit 32b outputs the control signal DATALATB_O in accordance with and the output signal D4 of the DFF 31d and an output signal D5 of the DFF 31e. Each DFF has the same configuration as FIG. 6.

Figure 16:
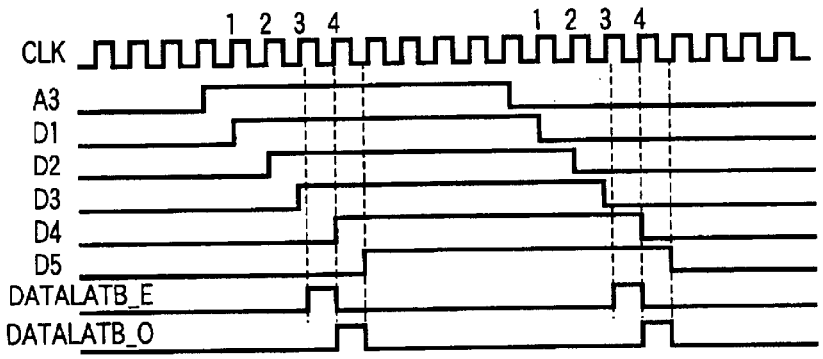
FIG. 16 is a timing chart showing the operation of FIG. 15.

FIG. 16 shows the operation of the generator circuit 30 shown in FIG. 15. As shown in FIG. 15, the most significant bit A3 signal of the page address is successively transferred to DFFs 31a to 31e in accordance with clock signals CLK and CLKB. The control signal DATALATB_E output from the EX-OR circuit 32a becomes high level at the third clock. The control signal DATALATB_O output from the EX-OR circuit 32b becomes high level at the fourth clock. The control signals DATALATB_E and DATALATB_O are output for the delay of three and four clocks every when the most significant bit A3 signal of the page address is changed. The control signal DATALATB_E thus generated is supplied to the even page second latch circuit 23 while the control signal DATALATB_O thus generated is supplied to the odd page second latch circuit 23. Therefore, the even page second latch circuit 23 is activated for the delay of three clocks from ATD, and holds 8-word data. The odd page second latch circuit 23 is activated for the delay of four clocks from ATD, and holds 8-word data.

Figure 17:
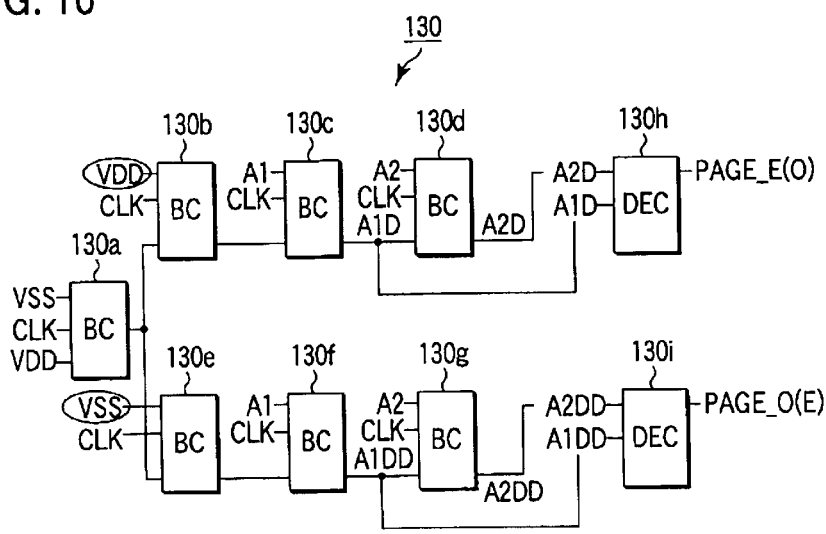
FIG. 17 is a circuit diagram showing the configuration of a generator circuit for control signals PAGE_E and PAGE_O shown in FIG. 13 and FIG. 14.

FIG. 17 shows the configuration of a generator circuit 130 for generating the control signals PAGE_E and PAGE_O. The generator circuit 130 is composed of several binary counters (BC) 130a to 130g, decoders 130h and 130i. The BC 130a always counts a clock signal CLK. The output terminal of the BC 130a is connected with BCs 130b to 130d in series while being connected with BCs 130e to 130g in series. The BC 130b is supplied with the clock signal CLK and power supply voltage VDD. The BC 130c is supplied with the clock signal CLK and an address bit A1 signal. The BC 130d is supplied with the clock signal CLK and an address bit A2 signal. BCs 130c and 130d successively count the output signal of the counter 130b in accordance with address bit A1 and A2 signals. The decoder 130h is supplied with an output signal A1D of the BC 130c and an output signal A2D of the BC 130d. The decoder 130h outputs control signal PAGE_E (O) based on these output signals.

The BC 130e is supplied with the clock signal CLK and ground voltage VSS. The BC 130f is supplied with the clock signal CLK and an address bit A1 signal. The BC 130g is supplied with the clock signal CLK and an address bit A2 signal. BCs 130f and 130g successively count the output signal of the counter 130e in accordance with address bit A1 and A2 signals.

The decoder 130i is supplied with an output signal A1DD of the BC 130f and an output signal A2DD of the BC 130g. The decoder 130i outputs control signal PAGE_O (E) based on these output signals.

Figure 18:
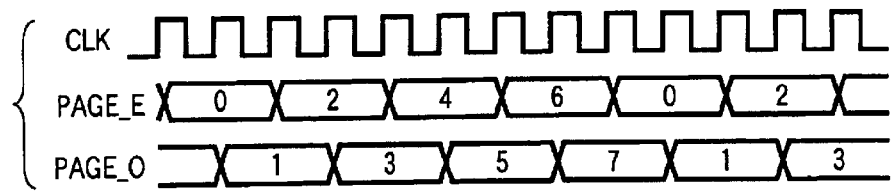
FIG. 18 is a timing chart showing the operation of FIG. 17.

FIG. 18 shows the even page control signal PAGE_E output from the decoder 130h and the odd page control signal PAGE_O output from the decoder 130i. The control signals PAGE_E and PAGE_O individually have two-clock cycle, and one-clock phase difference exists between these control signals PAGE_E and PAGE_O.

In the output switch circuit 114, decoding for odd or even is carried out every one clock. On the contrary, the page decoder 24 is decoded every two clock.

Incidentally, FIG. 18 shows the case where odd page is delayed one clock with respect to even page. However, the even page is delayed one clock with the respect to odd page depending on start address. The explanation about the configuration and operation in the case described above is omitted.

Figure 19:
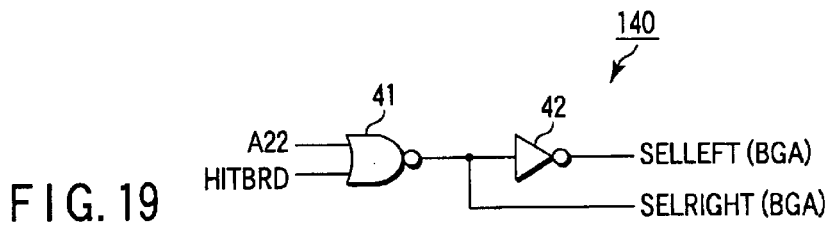
FIG. 19 is a circuit diagram showing the configuration of a bank select circuit.

FIG. 19 shows the configuration of a bank select circuit 140. The bank select circuit 140 is the same as the bank select circuit shown in FIG. 8. For this reason, the same reference numerals are used to designate the identical portions, and the details are omitted. The bank select circuit 140 outputs bank select signal SELRIGHT (BGA) or SELLEFT (BGA) in accordance with the most significant bit A22 signal of BGA and coincidence signal (HITBRD) indicative of detecting defective address.

Figure 20:
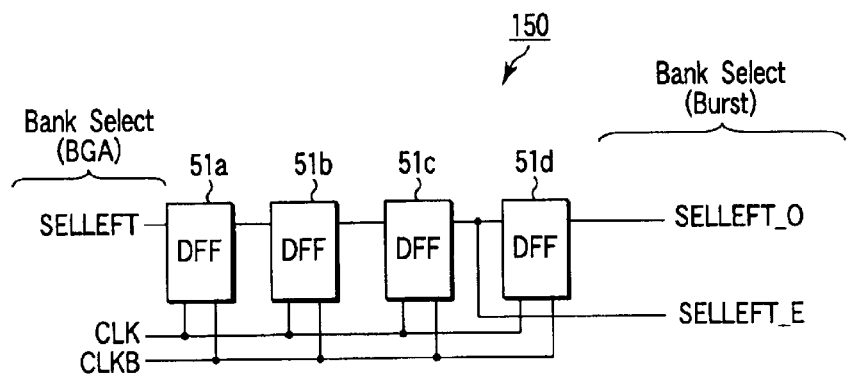
FIG. 20 is a circuit diagram showing the configuration of an output select circuit.

FIG. 20 shows the configuration of an output select circuit 150. The output select circuit 150 is composed of four series-connected DFFs 51a to 51d.

For example, the bank select signal SELLEFT (BGA) is supplied to an input terminal of the DFF 51a. These DFFs 51a to 51d are supplied with clock signals CLK and CLKB. The bank select signal SELLEFT (BGA) is successively transferred to DFFs 51a to 51d in accordance with clock signals CLK and CLKB. A SELLEFT_E output from the DFF 51c becomes high level at the third clock, and a SELLEFT_O output from the DFF 51d becomes high level at the fourth clock. Control signals SELLEFT_E and SELLEFT_O thus generated are supplied to the output switch circuit 16.

Figure 21:
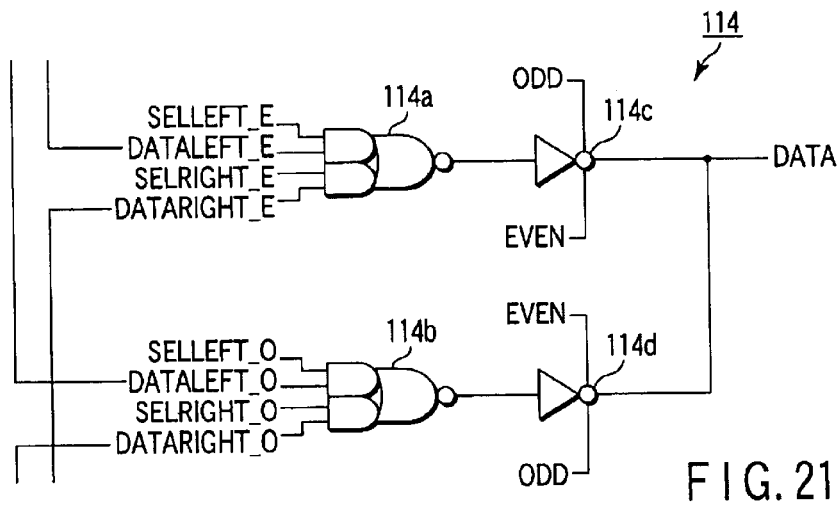
FIG. 21 is a circuit diagram schematically showing the configuration of an output switch circuit 114.

FIG. 21 shows the configuration of the output select circuit 114. The output select circuit 114 is composed of first decoders 114a and 114b for decoding 32 I/O into 16 I/O, and second decoders 114c and 114d for decoding 16 I/O data into one word. More specifically, the output select circuit 114 is provided with 16 circuits show in FIG. 21.

The first decoder 114a comprises two AND circuits, and a NOR circuit supplied with output signals of these AND circuits. Two AND circuits of the first decoder 114a are supplied with control signal SELLEFT_E, even page data DATALEFT_E of the bank 2, control signal SELRIGHT_E and even page data DATALEFT_E of the bank 1.

Two AND circuits of the first decoder 114b are supplied with control signal SELLEFT_O, odd page data DATALEFT_O of the bank 2, control signal SELRIGHT_0 and odd page data DATALEFT_O of the bank 1.

An output signal of the first decoder 114a is supplied to the second decoder 114c. The second decoder 114c comprises a clocked inverter circuit, which is controlled according to an odd select signal ODD and an even select signal EVEN. An output signal of the first decoder 114b is supplied to the second decoder 114d. The second decoder 114d comprises a clocked inverter circuit, which is controlled according to an odd select signal ODD and an even select signal EVEN. An output terminal of the second decoder 114d is connected to an output terminal of the second decoder 114c.

Figure 22:
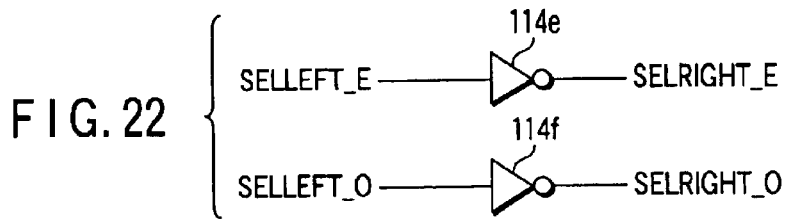
FIG. 22 is a circuit diagram showing the configuration of a generator circuit for control signals SELRIGHT_E and SELRIGHT_O.

FIG. 22 shows the configuration of a generator circuit for generating control signals SELRIGHT_E and SELRIGHT_O. The control signals SELRIGHT_E and SELRIGHT_O are generated in a manner that two inverter circuits 114e and 114f included in the output switch circuit 114 invert control signals SELLEFT_E and SELLEFT_O.

Figure 23:
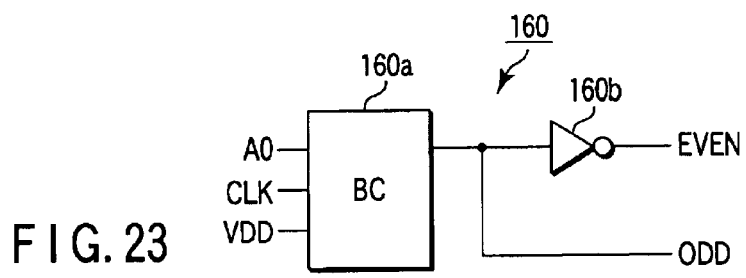
FIG. 23 is a circuit diagram showing the configuration of a generator circuit for an even select signal EVEN and an odd select signal ODD.
Figure 26:
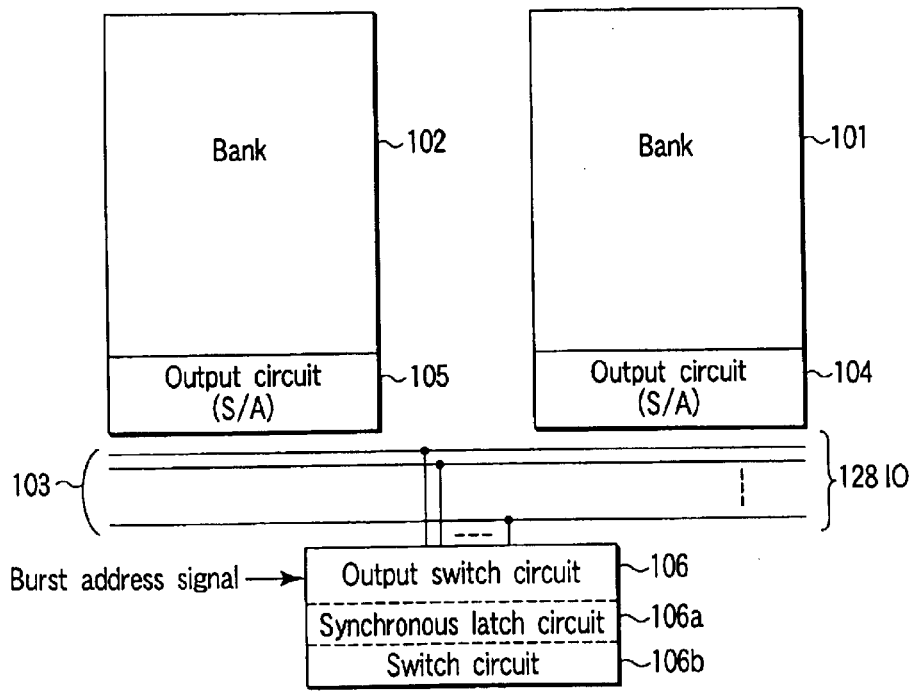
FIG. 26 is a view showing the configuration of a conventional semiconductor memory device.

FIG. 23 shows the configuration of a generator circuit 160 for generating the even select signal EVEN and the odd select signal ODD. The generator circuit 160 is composed of a binary counter (BC) 160a and an inverter circuit 160b. The binary counter (BC) 160a is supplied with the least significant address bit A0 signal, clock signal and power supply voltage VDD. The odd select signal ODD is output from the output terminal of the BC 160a, and the inverter circuit 160b inverts the signal so that the even select signal EVEN can be generated. Therefore, these even select signal EVEN and odd select signal ODD are alternately output every clock.

Figure 24:
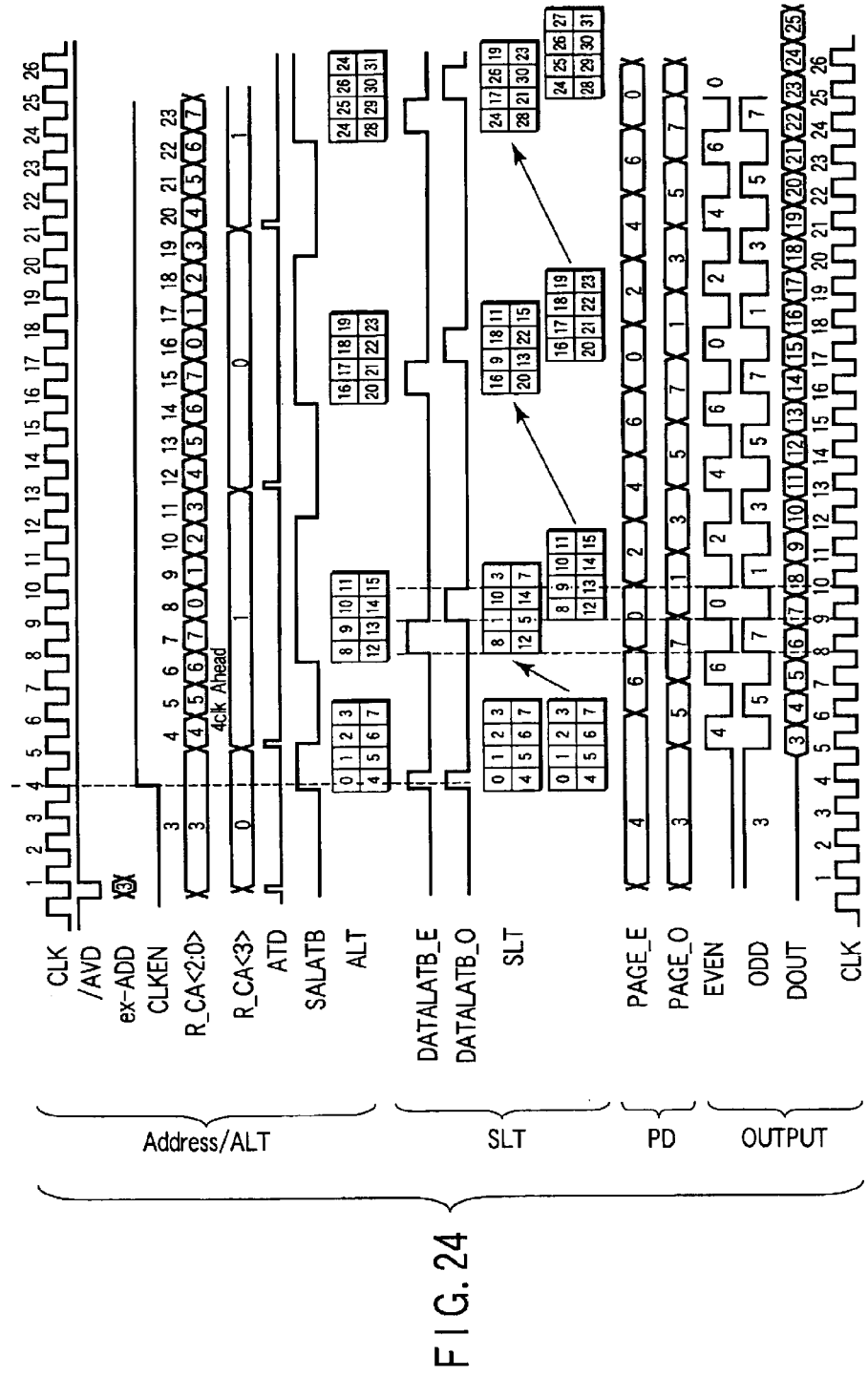
FIG. 24 is a timing chart showing the burst continuous read operation according to the third embodiment.

FIG. 24 shows the burst continuous read operation. The operation will be described with reference to FIG. 24. An address signal (ex-ADD) supplied from the external device is latched in accordance with a signal /AVD synchronizing with the external clock signal CLK. An output signal ATD of the address transition detection circuit (not shown) becomes high level in response to the change of the address signal. The next operation is made in response to the signal ATD. More specifically, after first latency elapses, a signal CLKEN rises, and the burst operation is started. The following operation is the same as the first embodiment. Namely, data is read from memory cell, and the sense amplifier 21 detects the data, and further, the first latch circuit 22 latches the data from the sense amplifier 21. The first latency period may be arbitrarily set.

In the first embodiment shown in FIG. 4, the second latch circuit (STL) 23 comprising the synchronous latch circuit holds the data of the first latch circuit (ALT) comprising the asynchronous latch circuit after four clocks from the signal ATD. On the contrary, the second latch circuit (STL) 23 makes the following operation in the third embodiment. Namely, the second latch circuit (STL) 23 holds even page data after three clocks from the signal ATD, and holds odd page data after four clocks, excluding the first latency. In other words, the second latch circuit 23 holds the even page data before one clock prior to the odd page data. The page decoder (PD) 24 transfers even and odd page data held in the second latch circuit 23 (SLT) to any of alternately corresponding first to four data lines 110 to 113 according to control signals PAGE_E and PAGE_O. The output switch circuit 114 outputs data of the selected bank according to control signals SELLEFT_E, SELLEFT_O, SELRIGHT_E and SELRIGHT_O. If the bank 1 is selected, the output switch circuit 114 successively outputs even and odd page data supplied individually from first and second data lines 110 and 111 in accordance with even and odd select signals EVEN and ODD.

Figure 25:
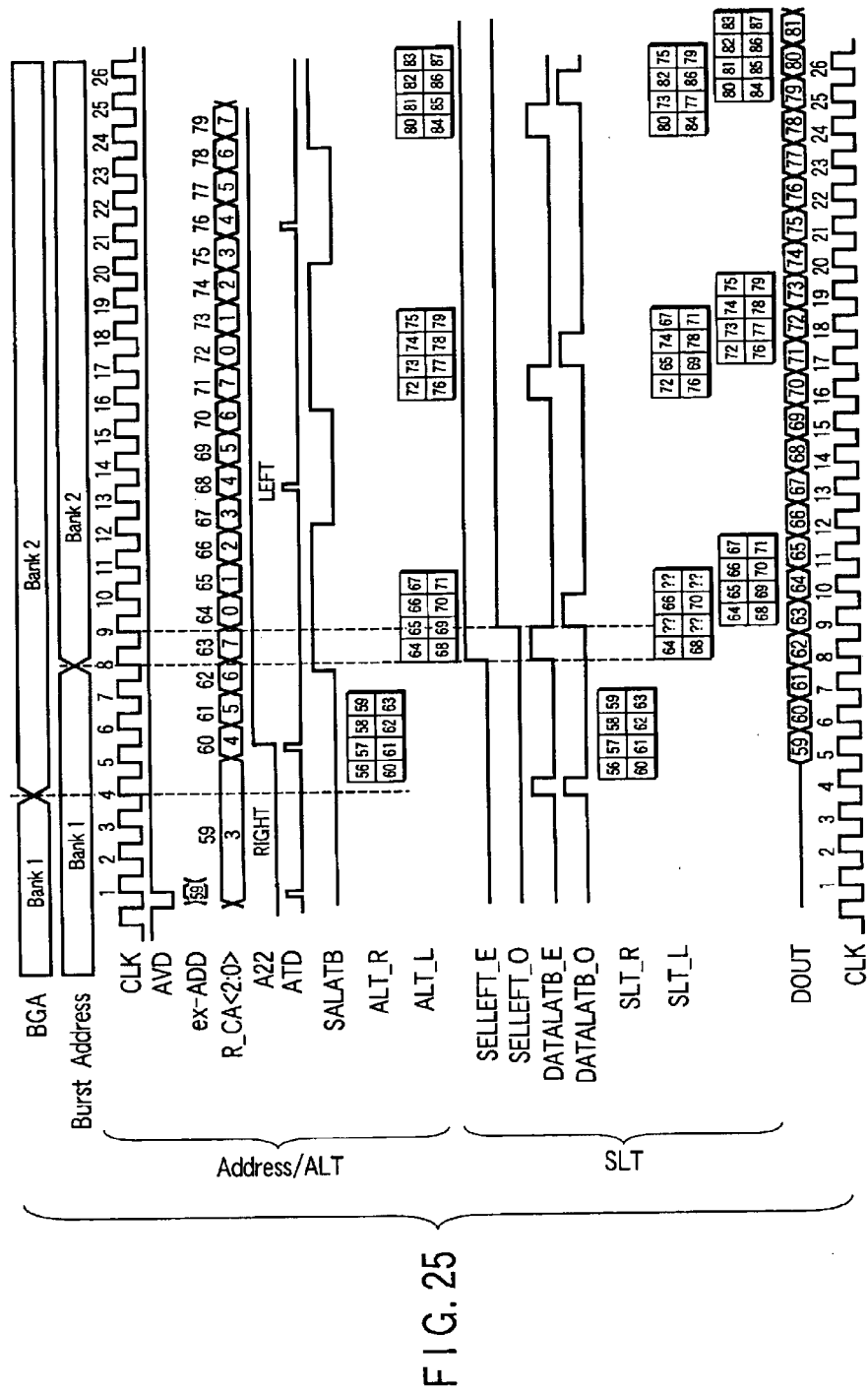
FIG. 25 is a timing chart showing the read operation in the bank boundary.

FIG. 25 shows the read operation in the boundary between banks. As seen from FIG. 25, when the read operation transfers from the bank 1 to the bank 2, that is, when background address (BGA) passes the boundary between banks, the following operation is made. Namely, the bank select circuit 140 shown in FIG. 19 generates the bank select signal SELLEFT (BGA) for selecting the bank 2. The output select circuit 150 shown in FIG. 20 outputs the signal SELLEFT_E for the delay of three clocks from the bank select signal SELLEFT, and outputs the signal SELLEFT_O for the delay of four clocks from there. Therefore, the output switch circuit 114 outputs data held in the second latch circuit (SLT_L) of the bank 2 later than data held in the second latch circuit (SLT_R) of the bank 1.

In order to continuously output data from the output switch circuit 114, data to be output must be transferred to the output switch circuit 114 before one clock from the output timing. For this reason, the signal SELLEFT_E is generated after three clocks from the bank select signal SELLEFT; on the other hand, the signal SELLEFT_O is generated after four clocks from there. The operation is carried out in the manner described above, and thereby, data in the boundary between two banks can be continuously read.

According to the third embodiment, first and second bus lines 110 and 11 are provided with respect to the bank 1, and third and fourth bus lines 112 and 113 are provided with respect to the bank 2. Even and odd page data are output via the first to fourth bus lines 110 to 113. The first to fourth bus lines 110 to 113 are individually 16 lines; therefore, they have bit width two times as much as the first and second embodiments. However, area penalty can be greatly reduced as compared with the conventional case.

When the output switch circuit 114 outputs one data of even and odd page, the other data thereof is output to any of the first to fourth bus lines 110 to 113 via the page decoder 24. Thus, it is possible to decrease the delay from the second latch circuit 23 functioning as the synchronous latch circuit to the output switch circuit 114, so that high-speed operation can be achieved.

The embodiments described above have explained about the NOR type flash EEPROM. The present invention is not limited to the NOR type flash EEPROM. In this case, the foregoing embodiments may be applied to various memories employing burst read regardless of the kind of memory cell.

In addition, the second and third embodiments may be combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a bank having a plurality of arrayed memory cells;

a bus line transmitting data read from the bank, and having a line equivalent to one word;

a plurality of sense amplifiers detecting data read from a memory cell of the bank in accordance with a read address;

a plurality of first holding circuits individually holding data output from each of the sense amplifiers;

a plurality of second holding circuits individually holding data output from each of the first holding circuits, and holding data output from the corresponding first holding circuit after being delayed by time that the read address gains with respect to burst address; and a decoder supplying data held in said plurality of second holding circuits to the corresponding line of the bus line.

2. The device according to claim 1, further comprising:

a delay circuit generating a control signal of the second holding circuit, the delay circuit generating the control signal by delaying the read address by time that the read address gains with respect to the burst address in accordance with a clock signal.

3. The device according to claim 1, wherein the first holding circuit comprises an asynchronous latch circuit, and the second holding circuit comprises a synchronous latch circuit.

4. The device according to claim 1, further comprising:

a first bus line transmitting data read from the first bank, and having a bit width equivalent to one word;

a second bus line transmitting data read from the second bank, and having a bit width equivalent to one word;

a plurality of first sense amplifiers detecting data read from a memory cell of the first bank in accordance with the read address;

a plurality of second sense amplifiers detecting data read from a memory cell of the second bank in accordance with the read address;

a plurality of first holding circuits individually holding data output from the first sense amplifiers;

a plurality of second holding circuits individually holding data output from the second sense amplifiers;

a plurality of third holding circuits individually holding data output from the first holding circuits after being delayed by time that the read address gains with respect to the burst address;

a plurality of fourth holding circuits individually holding data output from the second holding circuits after being delayed by time that the read address gains with respect to the burst address;

a first decoder supplying data held in said plurality of third holding circuits to the corresponding first bus line;

a second decoder supplying data held in said plurality of fourth holding circuits to the corresponding second bus line; and a bank select signal generator circuit outputting one bank data of the first and second banks, and thereafter, generating a signal for generating the other bank data after being delayed by time that the read address gains with respect to the burst address.

5. The device according to claim 4, wherein the first and second holding circuits comprise an asynchronous latch circuit, and the third and fourth holding circuits comprise a synchronous latch circuit.

6. A semiconductor memory device comprising:

a first bank having a plurality of arrayed memory cells;

a second bank having a plurality of arrayed memory cells;

first and second output circuits provided correspondingly to the first and second banks, the first and second output circuits outputting data read from the corresponding said plurality of memory cells in accordance with read address, and being activated after being delayed by time that the read address gains with respect to the burst address when select is changed from one of the first and second banks to the other thereof; and a select circuit selecting the first and second output circuits, the select circuits selecting one of the first and second banks after being delayed by time that the read address gains with respect to the burst address when select is changed from one of the first and second banks to the other thereof.

7. The device according to claim 6, further comprising:

a delay circuit delaying the read address by time that the read address gains with respect to the burst address in accordance with a clock signal, and generating control signals of the third and fourth holding circuits.

8. The device according to claim 6, wherein the bank select signal generator is a delay circuit for delaying a bank select signal by time that the read address gains with respect to the burst address in accordance with a clock signal.

9. A semiconductor memory device comprising:

a first bank having a plurality of arrayed memory cells;

a second bank having a plurality of arrayed memory cells:

a redundancy memory having a plurality of memory cells storing data of defective block of the first and second banks;

an address memory storing an address of the defective block;

a comparator comparing an address for reading one data of the first and second banks with the address of the defective block stored in the address memory, and outputting a coincidence signal if the former address and the later address coincide with each other; and a selector circuit selecting the redundancy memory after being delayed by time that the read address gains with respect to the burst address when the comparator outputs the coincidence signal.

10. The device according to claim 9, further comprising:
a first bus line transmitting data read from the first bank, and having a bit width equivalent to one word;
a second bus line transmitting data read from the second bank and the redundancy memory, and having a bit width equivalent to one word;
a plurality of first sense amplifiers detecting data read from a memory cell of the first bank in accordance with the read address;
a plurality of second sense amplifiers detecting data read from one of memory cells of the second bank and the redundancy memory in accordance with the read address;
a plurality of first holding circuits individually holding data output from said plurality of first sense amplifiers;
a plurality of second holding circuits individually holding data output from said plurality of second sense amplifiers;
a plurality of third holding circuits individually holding data output from the first holding circuits after being delayed by time that the read address gains with respect to the burst address;
a plurality of fourth holding circuits individually holding data output from the second holding circuits after being delayed by time that the read address gains with respect to the burst address, and individually holding data output from the second holding circuits after being delayed by time that the read address gains with respect to the burst address when the comparator circuit outputs the coincidence signal;
a first decoder supplying data held in said plurality of third holding circuits to the corresponding first bus line;
a second decoder supplying data held in said plurality of fourth holding circuits to the corresponding second bus line; and
an output circuit connected to the first and second bus lines, outputting one bank data of the first and second banks when the comparator outputs the coincidence signal, and thereafter, outputting data of the redundancy memory after being delayed by time that the read address gains with respect to the burst address.

11. The device according to claim 10, wherein the first and second holding circuits comprise an asynchronous latch circuit, and the third and fourth holding circuits comprise a synchronous latch circuit.

12. A semiconductor memory device comprising:
a bank having a plurality of arrayed memory cells;
a first bus line transmitting even data read from the bank, and having a bit width equivalent to one word;
a second bus line transmitting odd data read from the bank and the redundancy memory, and having a bit width equivalent to one word;
a plurality of first sense amplifiers detecting even data read from a memory cell of the bank in accordance with read address;
a plurality of second sense amplifiers detecting odd data read from the memory cell of the bank in accordance with read address;
a plurality of first holding circuits individually holding data output from each of the first sense amplifiers;
a plurality of second holding circuits individually holding data output from each of the second sense amplifiers;
a plurality of third holding circuits individually holding data output from the first holding circuits after being delayed by time that the read address gains with respect to the burst address;
a plurality of fourth holding circuits individually holding data output from the second holding circuits after one clock later than the third holding circuit;
a first decoder supplying data held in the third holding circuits to the first bus line;
a second decoder supplying data held in the fourth holding circuits to the second bus line; and
an output circuit connected to the first and second bus lines, and alternately outputting data transmitted from the first and second bus lines.

13. The device according to claim 12, wherein the first and second decoders operate at a two-clock cycle, and mutually have one-clock phase difference.

14. The device according to claim 12, wherein when the output circuit outputs desired data, the first and second decoders output the data to the first and second bus lines before one clock of the data output.

15. The device according to claim 12, wherein the first and second holding circuits comprise an asynchronous latch circuit, and the third and fourth holding circuits comprise a synchronous latch circuit.

16. A semiconductor memory device comprising:
first and second banks individually having a plurality of arrayed memory cells;
a first bus line transmitting even data read from the first bank, and having a bit width equivalent to one word;
a second bus line transmitting odd data read from the first bank and the redundancy memory, and having a bit width equivalent to one word;
a third bus line transmitting even data read from the second bank, and having a bit width equivalent to one word;
a fourth bus line transmitting odd data read from the second bank and the redundancy memory, and having a bit width equivalent to one word;
a first output circuit outputting even data read from a memory cell of the first bank in accordance with read address to the first bus line, and outputting odd data read from the memory cell of the first bank in accordance with read address to the second bus line;
a second output circuit outputting even data read from a memory cell of the second bank in accordance with read address to the third bus line, and outputting odd data read from the memory cell of the second bank in accordance with read address to the fourth bus line; and
a third output circuit connected to the first to fourth bus lines, and alternately outputting the even and odd data from one of first and second bus lines and third and fourth bus lines corresponding to selected one of the first and second banks.

17. The device according to claim 16, wherein the first output circuit comprises:
a plurality of first sense amplifiers detecting even data read from a memory cell of the first bank in accordance with read address;
a plurality of second sense amplifiers detecting odd data read from the memory cell of the first bank in accordance with read address;
a plurality of first holding circuits individually holding data output from each of the first sense amplifiers;
a plurality of second holding circuits individually holding data output from each of the second sense amplifiers;

a plurality of third holding circuits individually holding data output from the first holding circuits after being delayed by time that the read address gains with respect to the burst address;

a plurality of fourth holding circuits individually holding data output from the second holding circuits after one clock later than the third holding circuit;

a first decoder supplying data held in the third holding circuits to the first bus line; and a second decoder supplying data held in the fourth holding circuits to the second bus line.

18. The device according to claim 17, wherein the second output circuit comprises:

a plurality of third sense amplifiers detecting even data read from a memory cell of the second bank in accordance with read address;

a plurality of fourth sense amplifiers detecting odd data read from the memory cell of the second bank in accordance with read address;

a plurality of fifth holding circuits individually holding data output from each of the third sense amplifiers;

a plurality of sixth holding circuits individually holding data output from each of the fourth sense amplifiers;

a plurality of seventh holding circuits individually holding data output from the fifth holding circuits after being delayed by time that the read address gains with respect to the burst address;

a plurality of eighth holding circuits individually holding data output from the sixth holding circuits after one clock later than the third holding circuit;

a third decoder supplying data held in the seventh holding circuits to the third bus line; and a fourth decoder supplying data held in the eighth holding circuits to the fourth bus line.

19. The device according to claim 18, wherein the third and fourth decoders operate at a two-clock cycle, and mutually have one-clock phase difference.

20. The device according to claim 17, wherein the first and second decoders operate at a two-clock cycle, and mutually have one-clock phase difference.

* * * * *